United States Patent [19]

Variot et al.

[11] Patent Number: 5,386,144
[45] Date of Patent: Jan. 31, 1995

[54] SNAP ON HEAT SINK ATTACHMENT

[75] Inventors: Patrick Variot, San Jose; Qwai H. Low; Maniam Alagaratnam, both of Cupertino; Teresa Dalao, Milpitas, all of Calif.

[73] Assignee: LSI Logic Corporation, Milpitas, Calif.

[21] Appl. No.: 79,489

[22] Filed: Jun. 18, 1993

[51] Int. Cl.$^6$ ............................................. H01L 23/02
[52] U.S. Cl. ................................. 257/718; 257/706; 361/707; 361/714
[58] Field of Search ............... 257/718, 706, 719, 731, 257/732; 361/391, 380, 688, 707, 714

[56] References Cited

U.S. PATENT DOCUMENTS

| | | |
|---|---|---|
| 3,305,004 | 2/1967 | Barlowe ........................... 257/718 |
| 3,377,524 | 4/1968 | Bock et al. ........................ 361/709 |
| 4,235,285 | 11/1980 | Johnson et al. ................... 257/718 |
| 4,481,525 | 11/1984 | Calabro et al. ................... 257/718 |
| 4,607,685 | 8/1986 | Mitchell, Jr. ..................... 257/706 |
| 4,764,847 | 8/1988 | Eisenblätter et al. ............. 361/707 |

FOREIGN PATENT DOCUMENTS

| | | |
|---|---|---|
| 60-41246 | 3/1985 | Japan ............................. 257/718 |
| 1-286455 | 11/1989 | Japan ............................. 257/720 |
| 2-203555 | 8/1990 | Japan ............................. 257/718 |
| 2-205347 | 8/1990 | Japan ............................. 257/718 |
| 2-246142 | 10/1990 | Japan ............................. 257/718 |

*Primary Examiner*—Sara W. Crane
*Assistant Examiner*—T. M. Arroyo
*Attorney, Agent, or Firm*—Poms, Smith, Lande & Rose

[57] ABSTRACT

A heat sink (44–48) is detachably mechanically connected to an electronic component package (10) by means of a pair of mutually spaced and parallel spring rods (16, 18) that are fixed to the electronic component package and span a recess (14) formed in a surface of the package. The heat sink is formed with a projecting latching member (50) having a short shank (52) on the end of which is formed a laterally outwardly extending flange (60). The flange has shoulders (62) that slope outwardly and away from the heat sink body and distal ends on which are formed cam surfaces (66) that slope inwardly away from the heat sink body. The latching member (50) of the heat sink is pressed into the electronic component package recess between the resilient rods (16, 18) to force the rods apart and to pass the outer most ends (64) of the flange this causes the rods to contact the flange shoulders (62) in a slightly outwardly bowed position of the rods. The resilience of the rods accordingly tends to exert a constant force on the latching member flange tending to pull the heat sink against the electronic component package. Thus, the heat sink may be snapped into a latching engagement with the component package and the two parts may be readily snapped apart or disengaged.

10 Claims, 2 Drawing Sheets

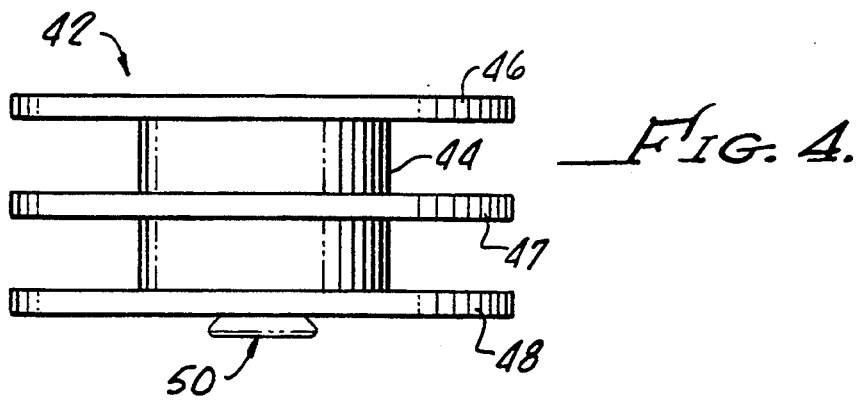
FIG. 4.
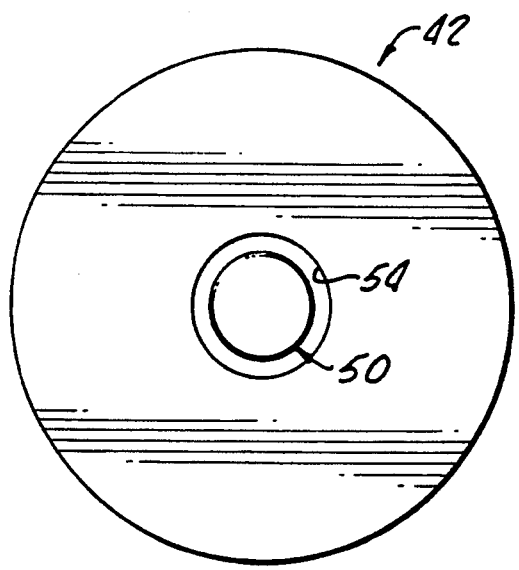
FIG. 5.
FIG. 6.
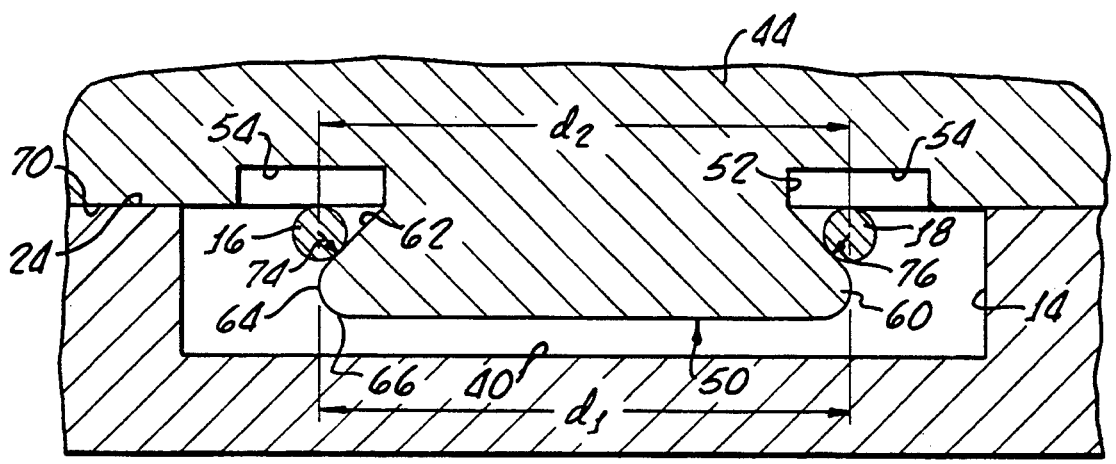

5,386,144

SNAP ON HEAT SINK ATTACHMENT

BACKGROUND OF THE INVENTION

1. Field of the Invention

The present invention relates to heat dissipation in electronic component packages, and more particularly, concerns an improved arrangement for detachably connecting a heat sink to an electronic component package.

2. Description of Related Art

As semi-conductor chip packages, including multi-chip modules and other electronic component packages, become more complex and operate at higher frequencies they generate more heat. The heat has to be removed from the device if it is to continue to operate and also to prolong the life of the device. Thus, in general, the component package configuration and construction is specifically designed to allow for maximized heat dissipation. Heat spreaders and heat sinks are employed in such electronic component packages to transfer heat to a moving air stream or on to another surface.

In the past, adhesives have been employed to attach a heat sink to an electronic component, directly or indirectly. The adhesive is dispensed on the component and the heat sink is accurately positioned in contact with the adhesive. The assembly is then heated in an oven to cure the adhesive. After such curing, the assembly reaches its full mechanical strength, but the heat sink is permanently bonded and can no longer be removed without damage to both heat sink and package. Use of adhesives has a number of other disadvantages. Although readily available, adhesives require additional process steps such as storing, mixing, dispensing and accuracy of placement and curing of adhesive materials. Adhesive must be stored under well controlled temperature or in some cases a two-part adhesive has to be mixed in proper amount which then has a limited shelf life. Dispensing of the adhesive is always difficult since it requires precision consistency of adhesive viscosity which can vary from batch to batch and is affected by temperature variation. Dispensing is a messy step since the dispensing nozzle or head must be cleaned after each process run.

After placement of the heat sink and adhesive onto the component package, the adhesive must be cured under specific temperature and time. This increases process cycle time.

A further problem with use of adhesive is that strength of the adhesive is critically dependent upon clean surfaces to which it must adhere. This requires that the heat sink and the component surfaces must be maintained free of contamination or must be cleaned prior to the dispensing of the adhesive and attachment of the heat sink.

All of these steps increase manufacturing cycle time and the overall cost of the units.

Accordingly, it is an object of the present invention to provide for attachment of a heat sink in a manner that avoids or minimizes above-mentioned problems.

SUMMARY OF THE INVENTION

An electronic component assembly comprises an electronic component package, a heat sink having an outwardly projecting latching member and spring means on the component package for resiliently clamping the latching member to the component package. According to a feature of the invention, the spring means are configured and arranged to exert a force on the latching member that pulls the heat sink toward the component package. According to another feature of the invention, the electronic component includes a latching recess and first and second mutually spaced resilient rods spanning the recess at a distance from the recess bottom. Ends of the rods are fixed to the electronic component. The heat sink has a body configured and arranged to bear on the electronic component and mounts a latching member extending from the body and including a shank extending from the heat sink body having a latching flange at the distal end of the shank. The flange has first and second shoulder portions sloping outwardly away from the body and engaging the first and second rods respectively to effectively bow the rods so as to cause the rods to resiliently press the latching flange into the recess and press the heat sink body against the electronic component package.

BRIEF DESCRIPTION OF THE DRAWINGS

In the accompanying drawings:

FIG. 4 and 5 are elevation and plan views, respectively, of a typical heat sink embodying a snap on latching member of the present invention.

FIG. 6 is a enlarged fragmentary sectional illustration showing the inter engagement of the latching system in position to hold a heat sink to an electronic component to package.

DESCRIPTION OF PREFERRED EMBODIMENTS

Figure 1:
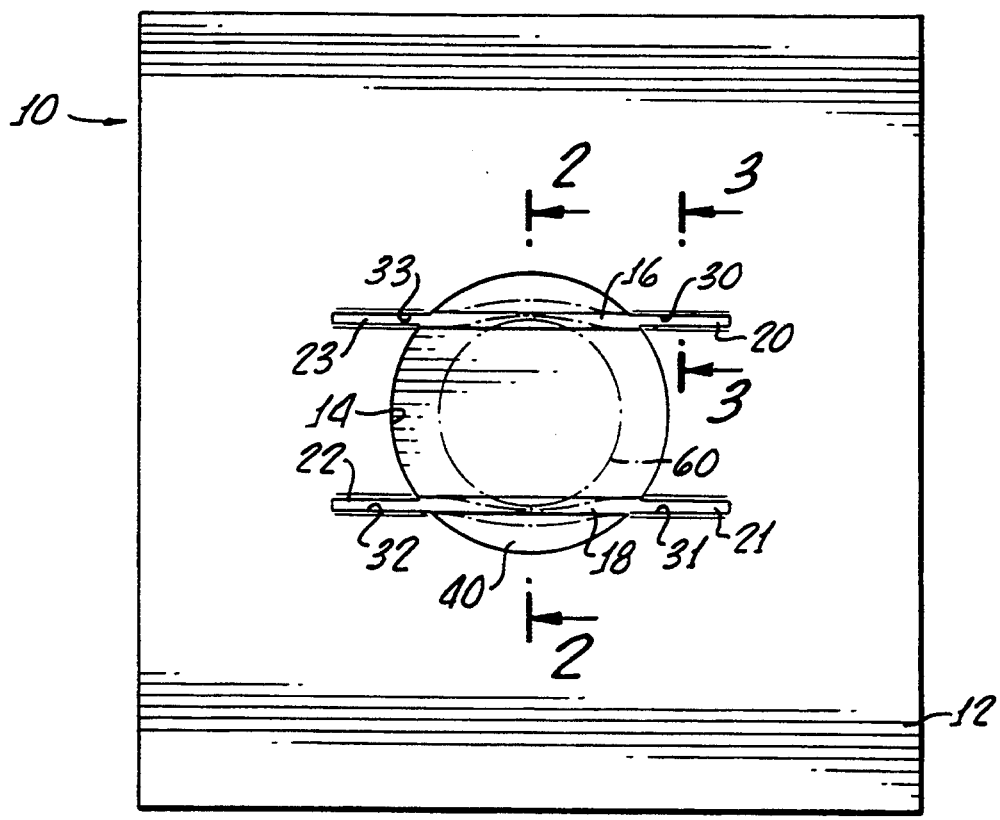
FIG. 1 is a plan view of an electronic component package embodying resilient spring rods for latching a heat sink.
Figure 2:
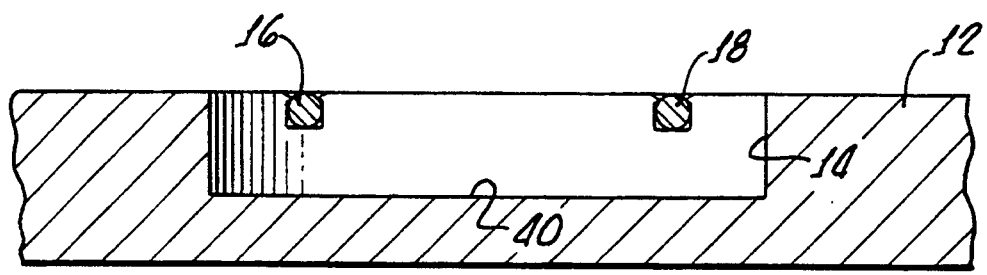
FIG. 2 is a section taken on lines 2—2 of FIG. 1.

Illustrated in FIG. 1 is an electronic component package generally indicated at 10, which may comprise an integrated circuit chip assembly such as a multi-chip module mounted on a multi-layer substrate, for example. Other types of integrated circuit packages or other electronic components may employ the snap-on heat sink attachment to be described herein. Package 10 includes a body section 12 in which is formed a generally circular recess 14. First and second mutually spaced and mutually parallel resilient rods 16, 18 made of a spring steel or equivalent, span the entire opening of the recess and have end portions 20, 21, 22, and 23 fixedly secured to portions of the package body 12 beyond the periphery of the recess. Central sections of the rods are effectively positioned within the recess with the uppermost points of each of these rods effectively lying in the plane of the upper surface 24 of the body 12. Although the ends of the rods 16, 18 may be secured to the body 12 in any one of a number of fashions, it is presently preferred to provide shallow elongated recesses 30, 31, 32 and 33 having a depth substantially equal to the diameter of the rods and a length slightly greater than the end of the rods that overlaps the body portions of the electronic package outside of the recess 14. The rod ends 20 through 23 are secured in the respective recesses 30 through 33 by any suitable means such as crimping, for example, as indicated at 36, 37 in FIG. 3. As can be seen in FIG. 2, upper portion of the rods are aligned with the upper surface 24 of the body 12 whereas the lowermost portions of the rods are spaced a distance above the bottom 40 of the recess 14.

Figure 3:
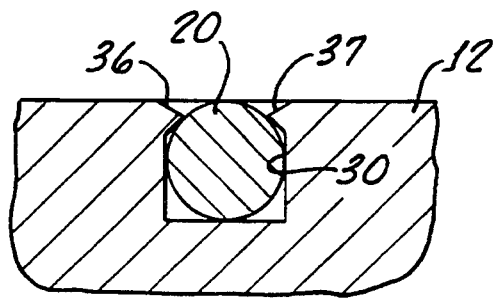
FIG. 3 is detailed illustration of one form of connection of the spring rods.

The electronic component package of FIGS. 1, 2 and 3 is cooled by contact with a heat sink 42 having a known configuration and which may be of the type illustrated in FIGS. 4 and 5. The heat sink includes a main body section 44 having a plurality of laterally outwardly extending and mutually spaced cooling fins 46, 47, 48. Both the fins and body 44 are of a circular configuration in a presently preferred exemplary embodiment. Obviously, other configurations of the heat sink body and fins may be employed as deemed necessary or desirable. The known and conventional heat sink configuration is modified for purposes of the present invention by the formation of a snap-on latching member 50 on a bottom portion of the heat sink and axially aligned with a central axis thereof. Configuration of the latching member is best seen in FIG. 6. The latching member is formed with a proximal circular cross-section shank 52, positioned at the heat sink body 44 and projecting outwardly from a recess 54 formed in the lower side (as viewed in FIG. 6) of the heat sink body 44. Projection of the shank 52 of the latching member 50 from the recess 54 effectively defines an annular configuration for recess 54.

Integrally formed on a distal end of the shank 54, at a distance from the bottom of recess 14, is a circular flange 60 that effectively forms an enlarged circular foot at the free end of the latching member shank 52. Flange 60 includes a circumferentially extending shoulder 62 that slopes outwardly away from the heat sink body 44 to a laterally outer flange peripheral end 64 that defines the maximum diameter of the flange 60. From the point of maximum diameter of the flange, point 64, the flange slopes inwardly away from the heat sink body to provide an inwardly inclined cam surface 66 that circumscribes the most distal portion of the flange 60.

The diameter of the flange 60 at its greatest extent, that is at flange peripheral end 64, as indicated by the distance $d_1$ in FIG. 6 and is substantially equal to the distance, $d_2$ which is the distance between center lines of the two resilient rods 16, 18.

In use of the snap on connection between the heat sink and the electronic component or package illustrated in FIGS. I through 6, the heat sink is moved toward the component body 12 in an orientation and position that causes the latching member 50 to begin to enter the component recess 14. Initially, the most distal camming surfaces 66 on the distal end of flange 60 contact rods 16 and 18 and resiliently press these apart to allow the entire flange or latching member foot 60 to pass between the two rods as the rods are resiliently bowed outwardly. This is illustrated by the dotted lines in FIG. 1. As the flange peripheral end 64 passes the center lines of the two rods outer, during the motion of the latching member into the recess 14, the outwardly bowed spring rods 16, 18 begin to move inwardly from the outwardly bowed position indicated in dotted lines in FIG. 1 toward the latching position, illustrated in FIG. 6. As the rods move inwardly, they ride along the sloping shoulder 62, pressing the latching member shoulder downwardly (as viewed in FIG. 6) by the cam action of the sloping shoulder. During the course of this inward motion of the bowed rods 16, 18, and before the rods have reached their completely unstressed condition, a surface 70 of the heat sink contacts a mating surface 24 of the electronic component package and prevents further motion of the latching member 50 into the recess 14. In this condition, the heat sink and electronic component assembly are in direct surface to surface contact, and the spring rods are still somewhat bowed. Therefore, the rods continue to exert a constant force on the latching member in the direction of arrows 74, 76 (FIG. 6). Accordingly, the heat sink is firmly and mechanically latched to the electronic component package body. It has been attached merely by a snapping action in which the specifically shaped latching member flange 60 is forced between the resilient rods.

The heat sink may be just as readily and easily detached from the electronic component body by simply reversing the described relative motion and pulling the heat sink and its latching member outwardly away from the electronic component body, thereby again springing the rods outwardly to allow the larger flange 60 to pass between the rods 16, 18.

Although the latching member 50 is made with a circular sectional configuration in a presently preferred embodiment, it will be readily appreciated that other configurations may be employed. Thus, for example, the latching member may be of a rectangular section with two substantially straight parallel and mutually spaced sloping shoulders 62 that runs substantially parallel to the spring rods 16, 18 during the latching and unlatching action. The spring rods 16, 18, instead of being crimped in the recesses 30 through 33 of the electronic component body, may be simply be bonded to the electronic component body by a suitable adhesive such as an epoxy or the like.

The described snap on latching arrangement eliminates the need for additional processes related to handling, preparing, dispensing and curing of typical adhesives. The heat sink is merely snaps directly onto the electronic component package and furthermore acts to relatively position or center the heat sink on the component package.

The heat sink can be removed whenever necessary without any damage to the component or the heat sink. Attachment of the heat sink can be performed after assembly of the electronic component packages on an assembly board and can be easily and readily automated. The latching member 50, at the base of the heat sink, is preferably manufactured at the same time as other features of the heat sink are made so that no additional manufacturing time is required.

The inter engaging configuration of the enlarged flange 60 of the latching member 50 and the fixed but resilient spring rods 16, 18 assure a predetermined position of the heat sink with respect to the electronic component assembly so that this snap on connection acts both for connection and as a locating and centering arrangement for positioning the heat sink relative to the electronic component package.

Although the latching member and recess have been shown and described as being formed on the heat sink and component respectively, it will readily be appreciated that the latching parts position may be reversed. The latching member may be formed or fixed to the component and the recess may be formed on the heat sink, which would also carry the spring rods.

There has been described a unique and simple mechanical snap on connection for rapidly attaching and readily detaching a heat sink to an electronic component package that provides a strong connection between the heat sink and the package, assuring accuracy of placement of the heat sink and enabling simple and inexpensive manufacture.

What is claimed is:

1. An electronic component assembly comprising
an electronic component package,
a heat sink having an outwardly projecting latching member, and
spring means on said electronic component package for resiliently clamping said latching member to said electronic component package, wherein
said latching member includes an outwardly sloping shoulder engaging said spring means, and
said spring means comprises a resilient rod fixed to said electronic component package and contacting said shoulder, said rod being resiliently deformed by its contact with said shoulder.

2. The electronic component assembly of claim 1 wherein said spring means is configured and arranged to exert a force on said latching member that pulls said heat sink towards said electronic component package.

3. An electronic component assembly comprising
an electronic component package,
a heat sink having an outwardly projecting latching member, and
spring means on said electronic component package for resiliently clamping said latching member to said electronic component package, wherein
said spring means comprises first and second mutually spaced resilient rods having end portions fixed to said electronic component package, said latching member being resiliently clamped between said rods.

4. The electronic component assembly of claim 3 wherein said heat sink has a body, and wherein said latching member includes a latch section spaced from said body, said latch section having a latch surface that slopes outwardly away from said body, said latch surface being captured between said resilient rods.

5. An electronic component assembly comprising
an electronic component package,
a heat sink having an outwardly projecting latching member, and
spring means on said electronic component package for resiliently clamping said latching member to said electronic component package, wherein
said electronic component package includes a latching recess having a bottom, said spring means comprising first and second mutually spaced and mutually parallel resilient rods spanning said latching recess at a distance from the bottom of said latching recess, said rods having ends fixed to said electronic component package, said heat sink having a body configured and arranged to bear on said electronic component package, said latching member comprising a shank extending from said heat sink body and a latching flange at a distal end of said shank, said latching flange having first and second shoulder portions sloping outwardly away from said body and engaging said first and second rods, respectively.

6. The electronic component assembly of claim 5 wherein said rods are spaced from each other by a first distance in unstressed condition, and wherein points on said first and second shoulder portions contacting said rods are spaced from each other by a second distance that is greater than said first distance, whereby said rods are resiliently bowed outwardly and resiliently press said shoulder portions into said electronic component package latching recess.

7. The electronic component assembly of claim 6 including first and second heat sink recess portions formed in said heat sink body adjacent said shank and adjacent said rods.

8. The electronic component assembly of claim 5 wherein said distal end of said flange has cam surfaces that slope inwardly away from said heat sink body, whereby when said latch member enters said latching recess said cam surfaces press said rods apart to permit entry of said latching flange between said rods.

9. A combination of an electronic component package and a detachable snap on heat sink, said combination comprising
an electronic component package having a latching recess formed therein,
first and second resilient rods spaced from each other by a first distance and having end portions fixedly secured to said electronic component package, said rods extending across said recess in substantially mutual parallel relation
a heat sink having a heat sink body,
a latching member having
a shank extending from said heat sink body and having a distal end,
first and second mutually opposed flange portions on said distal end, each said flange portions having a shoulder that slopes outwardly away from said heat sink body,
said first and second resilient rods being in contact with said first and second shoulder portions at first and second contact points, respectively, that are spaced from one another by a distance greater than said first distance, and
said flange having outer distal portions that are mutually opposed and formed with cam surfaces configured and arranged to force said rods away from one another when said latching member is inserted into said component package latching recess.

10. The combination of claim 9 wherein said latching member has a circular cross-section and said first and second flange portions comprise parts of a continuous peripheral flange formed on said latching member, and including an annular recess formed in said heat sink body adjacent said shank and said resilient rods.

* * * * *